United States Patent [19]
Quaderer et al.

[11] Patent Number: 5,822,225
[45] Date of Patent: Oct. 13, 1998

[54] SELF-CALIBRATING DATA PROCESSORS AND METHODS FOR CALIBRATING SAME

[75] Inventors: James Quaderer, Sunnyvale; Kirk Sanders, San Jose, both of Calif.

[73] Assignee: Ericsson Raynet Corporation, Menlo Park, Calif.

[21] Appl. No.: 310,244

[22] Filed: Sep. 21, 1994

[51] Int. Cl.⁶ ................................................. G01R 35/00
[52] U.S. Cl. ............................... 364/571.01; 364/571.04; 364/571.06; 341/140; 341/158
[58] Field of Search ................... 364/571.01, 571.02, 364/571.04–571.06; 341/110, 126, 133, 140, 144, 158, 159; 323/312–315

[56] References Cited

U.S. PATENT DOCUMENTS

| | | | |
|---|---|---|---|
| 4,200,933 | 4/1980 | Nickel et al. | 364/571 |
| 4,399,515 | 8/1983 | Gross | 364/571 |
| 4,532,601 | 7/1985 | Lenderking et al. | 364/571 |
| 4,642,636 | 2/1987 | Smith et al. | 340/870.04 |
| 4,700,174 | 10/1987 | Sutherland et al. | 340/347 |
| 4,715,003 | 12/1987 | Keller et al. | 364/571 |
| 4,896,282 | 1/1990 | Orwell | 364/571.05 |
| 5,012,181 | 4/1991 | Eccleston | 324/74 |
| 5,228,337 | 7/1993 | Sharpe et al. | 73/146.5 |
| 5,444,590 | 8/1995 | LeComte et al. | 361/18 |

*Primary Examiner*—Edward R. Cosimano
*Assistant Examiner*—Craig Steven Miller
*Attorney, Agent, or Firm*—Lyon & Lyon LLP

[57] ABSTRACT

Highly accurate, self-calibrating data processors and methods for calibrating the same use internal analog references with negligible time and temperature drifts. A first input reference signal set generated by any accurate, precision analog reference is applied to a data processor. The corresponding output response is compared to the theoretical ideal output response to determine the data processor's initial gain and offset errors. This information can be stored in non-volatile memory, recalled, and used to compensate for the data processor's initial gain and offset errors during actual use of the data processor. Subsequent errors due to time and temperature drifting can be determined by comparing the output responses to a second input reference signal set which is generated by the internal analog reference. The subsequent errors can be combined with the initial errors to compensate for system errors within the data processor.

2 Claims, 3 Drawing Sheets

SELF-CALIBRATING DATA PROCESSORS AND METHODS FOR CALIBRATING SAME

BACKGROUND OF THE INVENTION

The field of the invention pertains to calibration of electronic data processors, including, for example, analog-to-digital and digital-to-analog data processors.

Data processors have significantly developed over the last two decades and are now widely used in every facet of digital signal processing (DSP). For instance, in the telecommunications industry, numerous applications use data processors to convert analog signals to digital signals for processing and transmission, and subsequently to re-convert digital signals to analog for end-use. Numerous industrial machines also contain data processors as part of their operation and control mechanisms.

The rapid growth in DSP applications has fostered a corresponding demand for data processors which perform with high accuracy. However, despite the advances made in the field of data conversion, the manufacture and calibration of accurate data processors remains expensive.

Conventional data processors are typically manufactured with highly accurate, precision components to maintain system error within specified tolerances. However, such components may be expensive. For instance, data processors generally have an internal analog reference, such as a band-gap voltage reference, and the cost of these devices can be significant if a high level of accuracy is required. By way of example, a currently available 2.5V band-gap voltage reference from Analog Devices, model AD580UH, approximates absolute accuracy within 10 mV, or 0.4%, with negligible time and temperature drifts, and costs about $26.40. In comparison, Analog Devices model AD580SH, a 2.5V band-gap voltage reference with a tolerance of 25 mV, or 1%, also with negligible time and temperature drifts, costs only $8.40. Trim-calibration can be used to increase the accuracy of lower-cost analog references. Trim-calibration is usually performed by attaching a trim-potentiometer to an analog reference and adjusting the output of the analog reference until it matches the desired level displayed on an accurate, precision, external meter. Trim-calibration can be labor-intensive, however, and therefore, expensive. Thus, obtaining an accurate analog reference can be expensive, whether it is initially manufactured or trim-calibrated to an accurate level.

Moreover, conventional calibration techniques generally do not compensate for subsequent degradation in accuracy which occurs when a data processor's electrical components drift away from their initial values over time and temperature changes. Thus, conventionally calibrated data processors generally use only components with negligible time and temperature drifts. Again, these components are relatively expensive. For instance, data processors usually have some signal-conditioning circuitry to scale and buffer input signals prior to their conversion from analog to digital, or after their conversion from digital to analog. This circuitry generally consists of resistors and operational amplifiers (op-amps). However, resistors accurate to 0.1% with 25 PPM drift/°C. typically cost $0.30 each, as compared to 1% resistors with 100 PPM drift/°C., which only cost around $0.01 each. Thus, currently available data processors usually require relatively expensive components to ensure accuracy and stability over a range of time and temperature.

SUMMARY OF THE INVENTION

The present invention discloses highly accurate, self-calibrating data processors and methods for calibrating such data processors. The systems and methods according to the present invention can use relatively inexpensive components to achieve the same or better accuracy than conventionally calibrated data processors using more expensive components. Specifically, the systems and methods according to the invention use an internal analog reference which exhibits negligible time and temperature drifts.

Calibration for a data processor's initial gain and offset errors is performed by comparing a data processors's output response to an ideal output response when a first input reference signal set is applied by an accurate, precision analog reference. Preferably, the accurate, precision analog reference is located external to the data processor. The initial gain and offset errors are then determined by a microprocessor and stored in a non-volatile memory storage device, which is preferably located within the data processor. Later, when the data processor is in use, a microprocessor or computer, also preferably within the data processor, recalls the initial gain and offset error information and utilizes it to compensate the output response of the data processor.

In preferred methods and systems, subsequent errors due to time and temperature drifting can also be corrected. Immediately after the first input reference signal set is applied to the data processor, a second input reference signal set is applied and its corresponding output response is stored in a non-volatile memory storage device. The second input reference signal set is generated from the internal analog reference of the data processor, whereas the first input reference signal set can be generated from any accurate, precision analog reference. Immediately prior to actual use of the data processor, the second input reference signal set is again applied to the data processor. The subsequent error caused by time and temperature drifting is determined by comparing the output response to the original output response when the second input reference signal set was first applied. This additional error is then combined with the initial gain and offset error so that the total system error may be corrected by the microprocessor or computer at the time of actual use. Notably, the internal analog reference need not be highly accurate as long as it exhibits negligible time and temperature drifts. Moreover, other circuit components need not have negligible time and temperature drifts. Thus, the invention allows for use of relatively inexpensive components in a data processor and further eliminates the need for labor-intensive trim-calibration, which is conventionally performed on lower-cost analog references.

Accordingly, it is an object of the present invention to provide highly accurate, self-calibrating data processors and methods for producing the same. Other and further objects and advantages will appear hereinafter.

BRIEF DESCRIPTION OF THE DRAWINGS

FIG. 4 is a block diagram of yet another preferred embodiment of the invention.

DETAILED DESCRIPTION OF THE PREFERRED EMBODIMENTS

Figure 1:
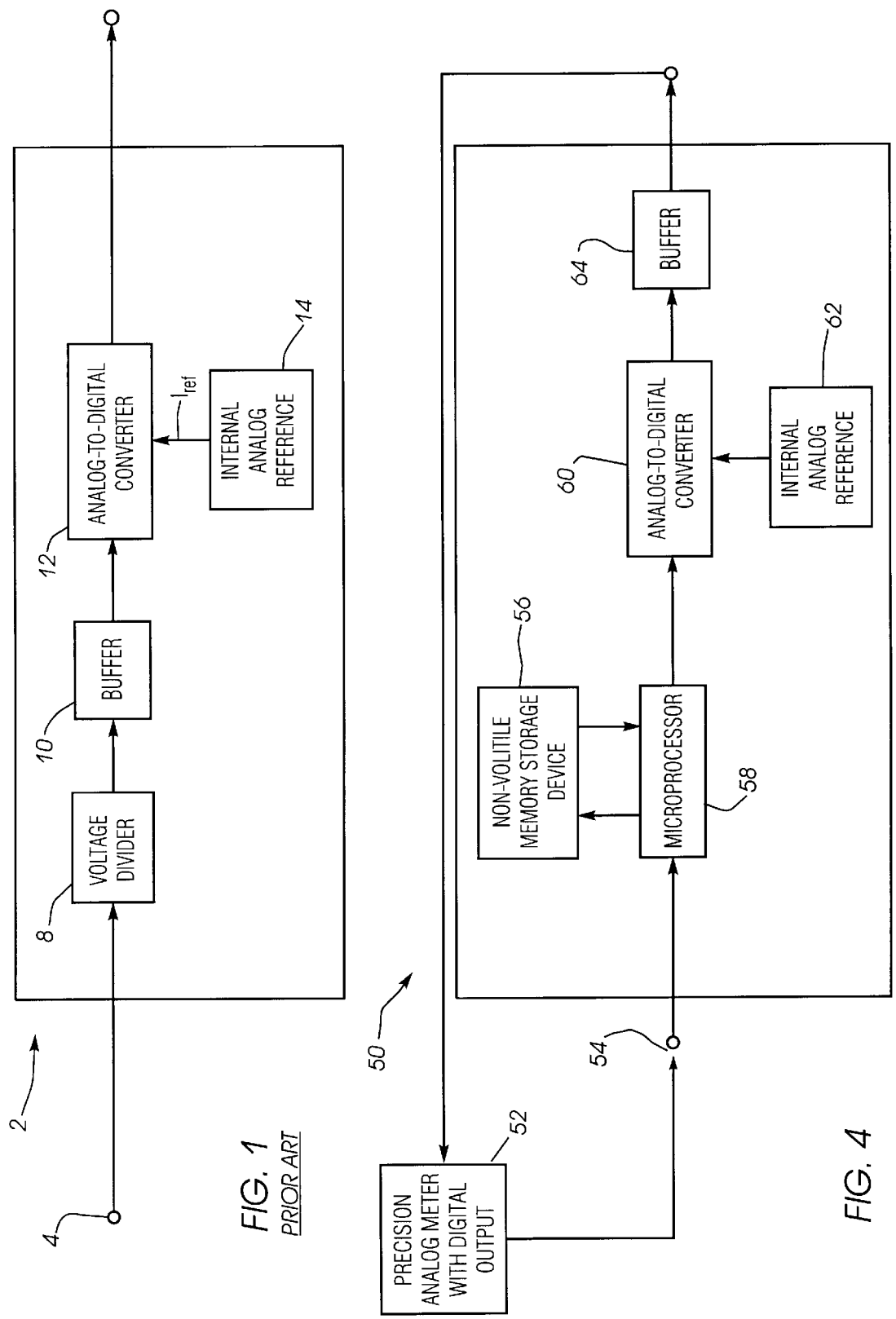
FIG. 1 is a block diagram of a conventional data processor.

Turning now to the drawings, FIG. 1 shows, in block diagram form, the general architecture of a conventional analog-digital data processor 2. The analog-to-digital processor 2 includes an external input 4 connected to a voltage divider 8, and a buffer 10. The buffer 10 is joined in series to an analog-to-digital converter 12, which is connected to an internal analog reference 14.

In actual use, the analog-to-digital processor 2 accepts an analog input signal from external input 4 which is scaled down by the voltage divider 8. The scaled analog input signal is then processed through the buffer 10, which further conditions the scaled analog input signal for the analog-to-digital converter 12. Buffers are used for numerous reasons, including, for instance, matching impedances, fault protection, translating differential signals to single-ended signals, and translating AC to DC signals. The scaled analog input signal is then processed through the analog-to-digital converter 12, which quantizes the scaled analog input signal into a digital signal. The analog-to-digital converter 12 performs this process by comparing the scaled analog input signal to the reference signal, $I_{ref}$, generated by the attached internal analog reference 14. The analog-to-digital converter 12 then outputs a digital signal comprising a series of digital output values, each value corresponding to a ratio between the scaled analog input signal and $I_{ref}$. The range of possible digital output values depends on the particular resolution of the analog-to-digital converter 12. For instance, a 10-bit analog-to-digital converter can output 1024 possible values. Assuming that the internal analog reference 14 is a 2.5V band-gap reference and that the scaled analog input signal is 1.0V, a 10-bit analog-to-digital converter would be expected to output a digital value of (1.0/2.5) * 1024=410, on a scale from 0 to 1023.

Figure 2:
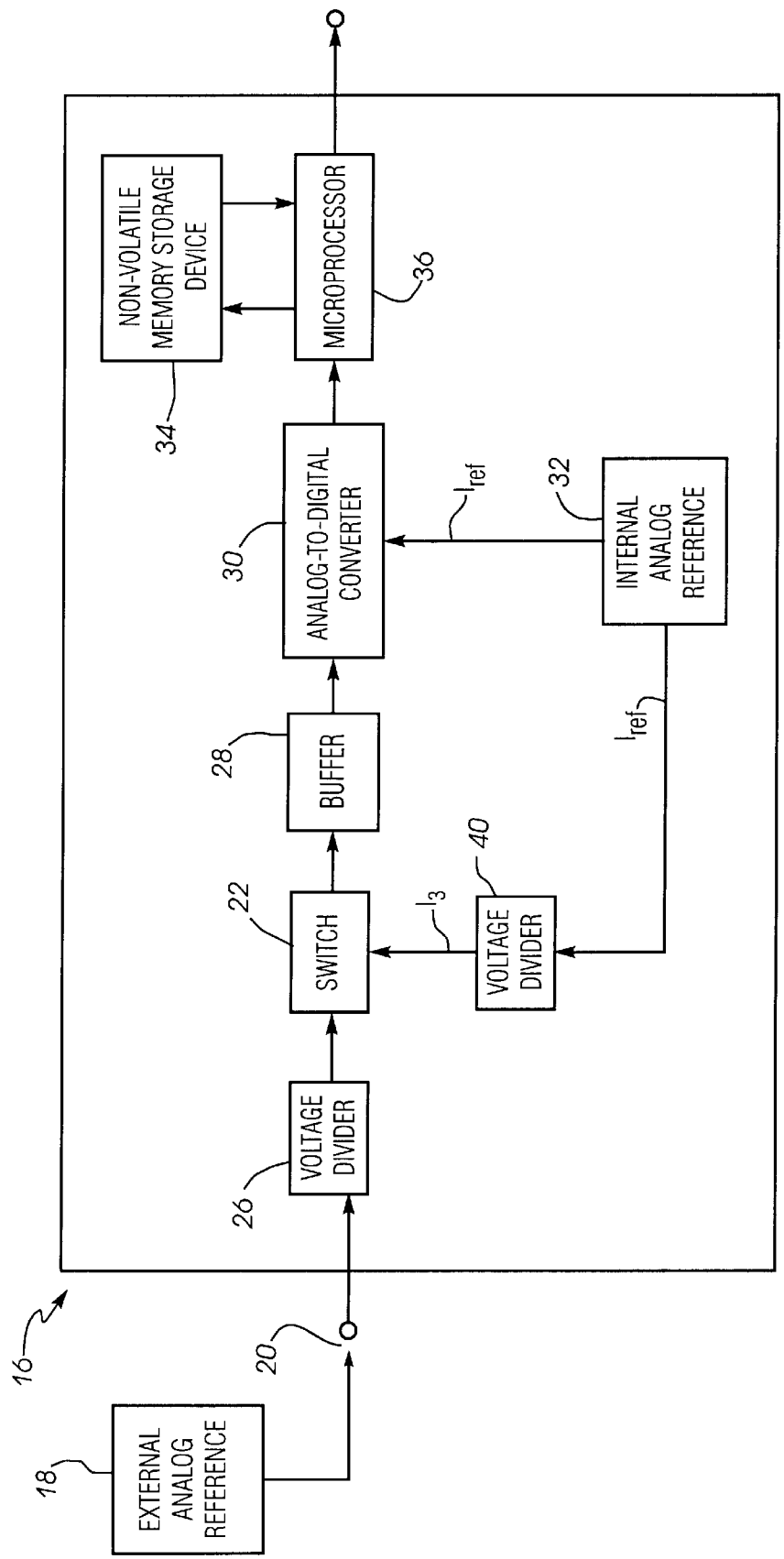
FIG. 2 is a block diagram of a preferred embodiment of the invention.

In FIG. 2, a preferred embodiment of the present invention is shown, wherein an accurate and precise external analog reference 18 is applied at the external input 20 to an analog-to-digital processor 16. Preferably, the external analog reference 18 is a band-gap voltage reference. However, other external analog references may be suitable. The external input 20 is connected to a first voltage divider 26, which in turn is attached to a switch 22. The switch 22 is also connected to a buffer 28 and a second voltage divider 40. Preferably, the switch 22 is an analog switch. Switch 22 is provided with two inputs comprising signals from voltage dividers 26 and 40, respectively, and a single output which is received by the buffer 28. The output signal from the buffer 28 is input into an analog-to-digital converter 30, which also receives an input signal, $I_{ref}$, from an attached, internal analog reference 32. $I_{ref}$ preferably has negligible time and temperature drift. As would be appreciated by one skilled in the art, the term "negligible" is construed to be the largest drift under which the data processor's systemic error remains within specified tolerances. The internal analog reference 32 is also connected to the voltage divider 40. A microprocessor 36 is provided having read/write access to a non-volatile memory storage device 34. An output signal from the analog-to-digital converter 30 is input into the microprocessor 36 and the output signal of the analog-to-digital processor 16 is provided from the microprocessor 36. Preferably, the non-volatile memory storage device 34 is a digital memory storage device, such as an NVRAM, as these are relatively inexpensive (about $0.50). It is also preferable that the NVRAM be contained within the data processor 16, so that its stored information can be readily accessed by the microprocessor 36. It is further preferable to design each of the voltage dividers 26 and 40 with matching resistors so that their time and temperature drifts mutually cancel.

There are several possible sources of error within the preferred embodiment shown in FIG. 2. The voltage divider 26 generally consists of resistors and the buffer 28 generally includes op-amps. Both these types of electronic components can introduce systemic errors. Additionally, the internal analog reference 32 can also introduce systemic errors. As described below, all of the error sources can be symbolically combined into two fundamental error components, a gain error, A, and an offset error, B, wherein:

I=analog input signal into external input 20;

$O_m$=measured digital output from the analog-to-digital converter 30;

$O_i$=ideal digital output from the analog-to-digital converter 30;

$K_1$=ideal scaling ratio due to the voltage divider 26. If two matched resistors are used for the voltage divider 26, $K_1$=0.5;

$K_2$=ideal scaling ratio representing the resolution of the analog-to-digital converter 30 and $I_{ref}$. For instance, if the analog-to-digital converter 30 has 10 bits of resolution and the internal analog reference 32 is a 2.5V band-gap reference, $K_2$=(1024/2.5V);

X=tolerance error due to resistors (X=1 represents no error)

Y=op-amp offset error (Y=0 represents no error)

Z=internal analog reference error (Z=1 represents no error)

Then $$O_m = (I * K_1 * X + Y) * K_2 * Z$$

and $$O_i = I * K_1 * K_2.$$

$O_m$ can be rewritten as:

$$\begin{aligned} O_m &= (I * K_1 * K_2 * X * Z) + K_2 * Y * Z \\ &= O_i * X * Z + K_2 * Y * Z \\ &= O_i * A + B \end{aligned}$$

where

A=X*Z

B=$K_2$*Y*Z

The gain error, A, is composed of the resistor error, X, and the internal analog reference error, Z. The offset error, B, is composed of the ideal scaling ratio $K_2$, op-amp offset error, Y, and the internal analog reference error, Z.

The internal analog reference 32 introduces, at most, an initial error, as the method according to the invention requires that the internal analog reference 32 have negligible time and temperature drift. However, the resistors in the voltage divider 26 and the op amps in the buffer 28 can introduce both initial errors and subsequent errors due to time and temperature drifting. These subsequent drift errors affect the values of A and B, as they depend directly on X and Y, the resistor tolerance error and the op-amp offset error, respectively. Accordingly, to fully account for all systemic errors, calibration must cancel out both the initial error and subsequent error due to drifting.

To calibrate for the analog-to-digital processor's initial gain and offset errors, the switch 22 is set so that the input from the voltage divider 26 is passed to the buffer 28. Then, a first input reference signal set is generated by the external analog reference 18 and applied to the external input 20.

Once the first input reference signal has been applied, each subsequent input reference signal is preferably applied as soon as the previous input reference signal has been processed through the analog-to-digital converter 30 and all transient responses due to the previous input reference signal have dissipated. It is also preferable that each input reference signal be a DC signal, however, AC signals can also be used if the analog-to-digital processor 16 has circuitry to convert AC signals to DC signals. This circuitry may be contained, for instance, in the buffer 28, which is typically used in many time-varient signal measurement systems.

Preferably, the first input reference signal set consists of only two input reference signals, $I_1$ and $I_2$, however, as discussed later, additional signals may also be applied. Any two different signals may be used for $I_1$ and $I_2$, as long as neither exceeds the data processor's range of operation, taking into consideration the data processor's gain and offset errors. Preferably, $I_1$ and $I_2$ are chosen so that after processing through the analog-to-digital converter 30, their corresponding theoretical, ideal digital output values $O_{1t}$ and $O_{2t}$, respectively, will be relatively close to the analog-to-digital converter's minimum and maximum output values. Choosing $I_1$ and $I_2$ in this manner will increase accuracy as a larger range of input values is covered. However, it is further preferable to choose $I_1$ and $I_2$ so that a margin is left between $O_{1t}$ and $O_{2t}$ and the analog-to-digital converter's minimum and maximum digital output values. The margin increases linearity of response and also allows for systemic gain and offset errors. Typically, the low-end margin need only allow for offset errors, as gain error is less prevalent at the minimum input value. However, the high-end margin may be larger, as gain error can substantially increase near the maximum input value. The actual component specifications must be taken into account in choosing actual margin values. Additionally, it is preferable to choose $I_1$ and $I_2$ so that $O_{1t}$ and $O_{2t}$ are integer values, rather than fractional numbers such as 101.5.

After $I_1$ and $I_2$ are processed through the analog-to-digital converter 30, their actual measured digital output values, $O_1$ and $O_2$, respectively, are received by the microprocessor 36. The microprocessor 36 compares $O_1$ and $O_2$ to $O_{1t}$ and $O_{2t}$, respectively, to determine the initial gain and offset errors of the analog-to-digital processor 16, denoted by $A_1$ and $B_1$, respectively. As previously discussed, $I_2$ is preferably applied as soon as $I_1$ has been processed through the analog-to-digital converter 30 and its transient effects have dissipated. By applying $I_1$ and $I_2$ in this manner, the initial gain error $A_1$ and offset error $B_1$ should remain constant during the process, in light of the minimal elapsed time and temperature gradient. Then, $A_1$ and $B_1$ can be algebraically determined by the microprocessor 36 as follows:

$$O_1 = O_{1t} * A_1 + B_1$$

$$O_2 = O_{2t} * A_1 + B_1$$

Thus,
ti $A_1 = (O_1 - O_2)/(O_{1t} - O_{2t})$ $$B_1 = O_2 - O_{2t} * A_1$$

Since the external analog reference 18 used to generate $I_1$ and $I_2$ is accurate and precise, the ideal digital output values, $O_{1t}$ and $O_{2t}$, corresponding to $I_1$ and $I_2$, respectively, can be accurately calculated and pre-programmed into the microprocessor 36 or stored in the non-volatile memory storage device 34. Then, since $O_1$ and $O_2$ are output to the microprocessor 36 from the analog-to-digital converter 30, the microprocessor 36 has all the information it needs to calculate $A_1$ and $B_1$ from the above equations. At this point, the microprocessor 36 can calculate and store the values of $A_1$ and $B_1$ into the non-volatile memory storage device 34. Alternately, the microprocessor can store the values of $O_1$ and $O_2$ in the non-volatile memory storage device 34 for later retrieval and use in calculating $A_1$ and $B_1$. If the analog-to-digital processor's components do not change over time or temperature, then calibration is complete as the values of A and B remain at their initial values, $A_1$ and $B_1$, respectively. However, if any components experience time or temperature drifts, then further calibration must be performed to cancel out these subsequent errors.

As previously discussed, the gain error A depends on the resistor tolerance error X and the internal analog reference error Z, while the offset error B depends on $K_2$, the op-amp offset error Y and the internal analog reference error Z. While resistor characteristics can fluctuate significantly over time and temperature, a matched resistance, such as a voltage divider comprised of two or more of the same resistors, fluctuates much less as the resistor drifts mutually cancel. Therefore, since the voltage divider 26 is built with matched resistors, the resistor tolerance error X is negligible. And, since the internal analog reference 32 also exhibits negligible time and temperature drift, Z is negligible. Thus, the gain error A should remain relatively constant over time and temperature. On the other hand, the op-amp offset error Y may change significantly if inexpensive op-amps are used in lieu of more expensive components which have very low offset drift. This may cause the offset error term, B, to change from its initial value, $B_1$, even if Z is negligible and $K_2$ is constant.

To calibrate the change in B due to subsequent drift errors, a second input reference signal set is applied to the data processor. Preferably, the second input reference signal set consists of only one signal, $I_3$. First, the switch 22 is set so that the buffer 28 receives the output from the voltage divider 40. Referring to FIG. 2, the signal $I_{ref}$ from the internal analog reference 32 is scaled by the voltage divider 40 to generate an input reference signal, I3 which the switch 22 passes to the buffer 28. The corresponding digital output value from the analog-to-digital converter 30, $O_3$, is stored in the non-volatile memory storage device 34, in the same manner as $A_1$ and $B_1$ or $O_1$ and $O_2$.

Any value can be used for $I_3$ so long as it does not cause the analog-to-digital converter 30 to exceed its range of operation. However, as will be discussed, it is important that $I_3$ be easily reproduced and that the its value not drift significantly. Therefore, it is preferable to choose $I_3$ to be ½ $I_{ref}$, since the voltage divider 40 can be simply designed using any pair of matched resistors, as their time and temperature drifts will mutually cancel. As would be appreciated by one skilled in the art, $I_{ref}$ can also be scaled using more than two matched resistors, or with resistors having negligible time and temperature drifts.

Immediately prior to when the analog-to-digital processor 16 is actually used, the switch 22 is again set to pass the output from the voltage divider 40, to the buffer 28. The voltage divider 40 again scales $I_{ref}$ into an input reference signal, $I_3'$, which is processed through the switch 22, buffer 28, and analog-to-digital converter 30. Since the internal analog reference 32 has negligible time and temperature drift, $I_{ref}$ remains constant and thus, $I_3'$ is necessarily equal to $I_3$ since the voltage divider 40 also has negligible time and temperature drifts, as was intended by using matched resistors.

The subsequent drift error, $B_2$, can then be determined from the output response from the analog-to-digital converter 30, $O_3$', to the input reference signal $I_3$'. Since $I_3$ equals $I_3$', the difference between $O_3$' and $O_3$ represents the subsequent drift error, $B_2$ (=$O_3$'-$O_3$) that has occurred since $A_1$ and $B_1$ were calculated. Thus, the microprocessor 36 can recall the value of $O_3$ from the non-volatile memory storage device 34 and calculate the value of $B_2$, which can then be either stored in the non-volatile memory storage device 34 or held in the microprocessor's RAM. Alternately, the value of $O_3$' may be stored in the non-volatile memory storage device 34 or held in the microprocessor's RAM and the subsequent drift error $B_2$ determined when the analog-to-digital processor 16 is later used.

As would be apparent to one skilled in the art, $I_3$ should be applied as soon as $I_2$ has been processed through the analog-to-digital converter 30 and its transient effects have dissipated. By applying $I_3$ consecutively in this manner, the difference between $O_3$ and $O_3$' will accurately represent the drift error, $B_2$, subsequent to the determination of the initial gain and offset errors, $A_1$ and $B_1$. The analog-to-digital processor 16 is now calibrated for subsequent drift errors.

During actual use of the analog-to-digital processor 16, an input signal $I_{in}$ is applied to the voltage divider 26, where it is scaled. The scaled analog input signal is then processed through the switch 22, which passes the scaled analog signal through to the buffer 28. The scaled analog input signal is then processed through the analog-to-digital converter 30. The resultant response from the analog-to-digital converter 30, $O_{pre-comp}$, is adjusted by the microprocessor 36, which recalls either the values of $A_1$ and $B_1$, or $O_1$ and $O_2$ from the non-volatile memory storage device 34, depending on which set of values was stored. If $O_1$ and $O_2$ were stored, the microprocessor 36 uses their values to calculate $A_1$ and $B_1$. The values of $O_3$ and $O_3$', or $B_2$ are recalled from either the non-volatile memory storage device 34 or from the microprocessor's RAM, depending on where they were stored. The microprocessor 34 then determines and outputs the adjusted or compensated response, $O_{comp}$, from the analog-to-digital processor 16. If $B_2$ was stored, $O_{comp}$ is determined as:

$$O_{comp}=(O_{pre-comp}-B_1-B_2))/A_1$$

If $O_3$ and $O_3$' were stored, then $O_{comp}$ is determined as:

$$O_{comp}=(O_{pre-comp}-B_1-(O_3'-O_3))/A_1$$

In embodiments whose components have negligible time and temperature drifts, calibration of subsequent drift errors is unnecessary, as is the switch 22, since there is no need to apply a second input reference signal set. For these embodiments, $O_{comp}$ is determined as:

$$O_{comp}=(O_{pre-comp}-B_1)/A_1$$

Notably, the only significant error source which has not been compensated for is the external analog reference 18, so the drift of this device must be low enough to keep the system error within specified tolerances. Additionally, the voltage divider 26 is unnecessary if the maximum external input signal is approximately equal to $I_{ref}$, since there would be no need to scale the input analog signal. On the other hand, if the maximum input analog signal is much less than $I_{ref}$, a gain amplifier can be used in place of the voltage divider 26 to increase the input signal level prior to entering the switch 22.

Since $I_1$ and $I_2$ are applied at the external input 20 to the analog-to-digital processor 16, the entire initial system error of the analog-to-digital processor 16 is calibrated. Additionally, since $I_3$ and $I_3$' are applied at the switch 22, the subsequent drift error for all components between the switch 22 and the analog-to-digital converter 30 are calibrated. However, if it is desired, the invention may be readily implemented to calibrate only a sub-section of the analog-to-digital processor 16. For instance, to calibrate only the analog-to-digital converter 30, the first and second set of input reference signals can be applied directly at the input to the analog-to-digital converter 30. As would be apparent to one skilled in the art, the method according to the invention can be implemented in numerous other embodiments, depending on the particular circuit components being calibrated.

In the above preferred embodiment, it has been assumed that the gain error A does not change over time or temperature. However, it is within the broad scope of the invention to take additional measurements to include subsequent gain errors within the calibration process.

Figure 3:
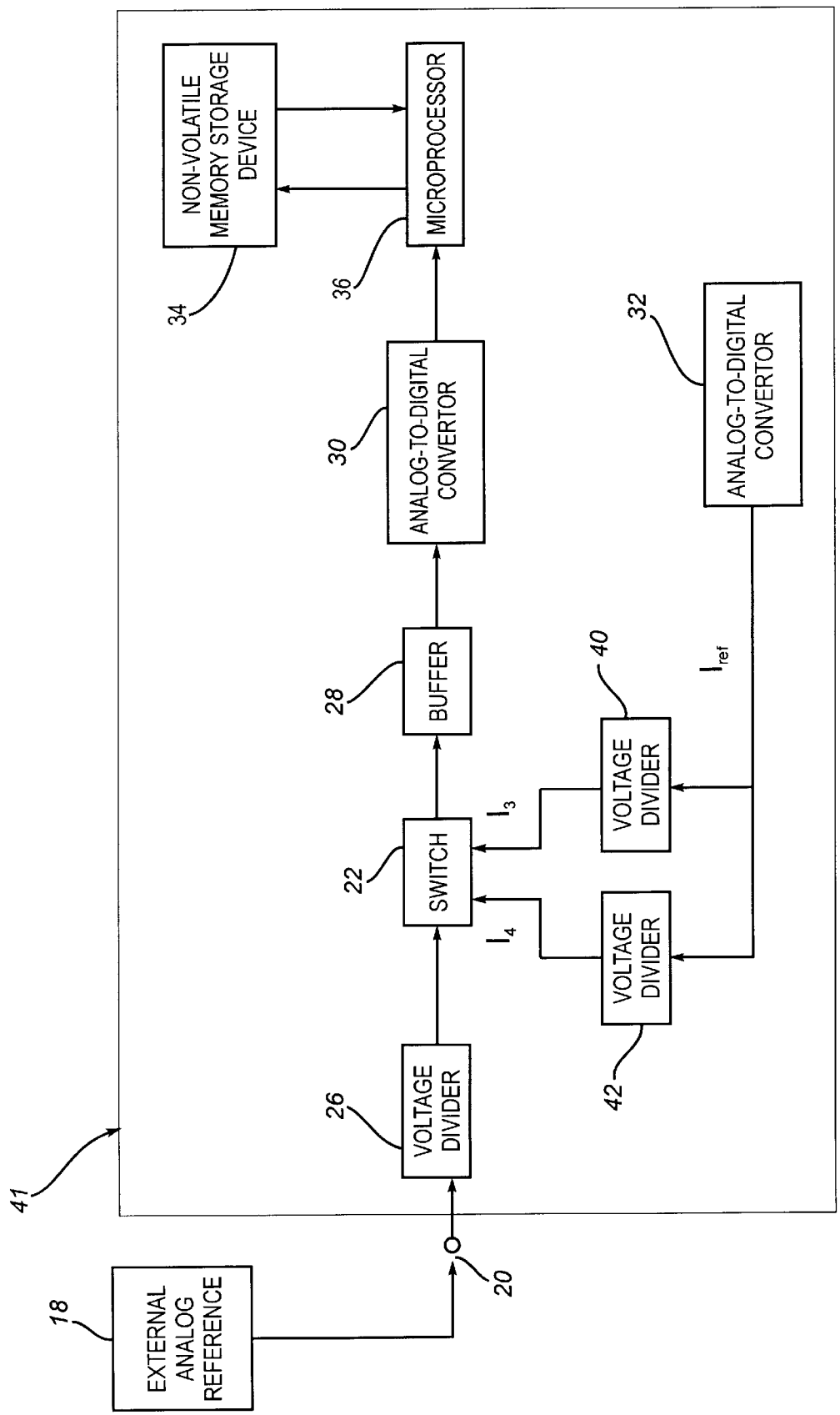
FIG. 3 is a block diagram of another preferred embodiment of the invention.

FIG. 3 provides an example of one such embodiment, in which an analog-to-digital processor 41 calibrates for both subsequent gain and offset errors. In FIG. 3, a third voltage divider 42 is provided between the switch 22 and the internal analog reference 32. The voltage divider 42 scales $I_{ref}$ to a signal $I_4$ which is distinct from $I_3$. Preferably, the voltage divider 42 again consists of matched resistors, so that any time and temperature drifts mutually cancel. However, the voltage divider 42 cannot have the same scaling ratio as the voltage divider 40, since its purpose is to create $I_4$ distinct from $I_3$. For example, the voltage divider 42 could be comprised of 3 matched resistors in series so that $I_{ref}$ can be scaled into ⅓ increments. The initial gain and offset errors can be determined in the same manner as discussed for the embodiment shown in FIG. 2. The subsequent gain and offset errors due to drifting can then be determined by taking an additional set of output measurements, $O_4$ and $O_4$', in the same manner as $O_3$ and $O_3$', respectively, for the embodiment shown in FIG. 2:

If $O_{3t}$, $O_{4t}$, $O_{3t}$' and $O_{4t}$' represent the theoretical ideal digital output values to $I_3$, $I_4$, $I_3$' and $I_4$', respectively:

$$O_3=O_{3t}*A_1+B_1 \tag{1}$$

$$O_4=O_{4t}*A_1+B_1 \tag{2}$$

$$O_3'=O_{3t}'*A+B \tag{3}$$

$$O_4'=O_{4t}'*A+B \tag{4}$$

Combining equations (3) and (4):

$$A=(O_4'-O_3')/(O_{4t}'-O_{3t}') \tag{5}$$

Since it is assumed that $I_3$'=$I_3$ and $I_4$'=$I_4$, it follows that: $O_{3t}$'=$O_{3t}$ and $O_{4t}$'=$O_{4t}$.
Therefore, $$A=(O_4'-O_3')/(O_{4t}-O_{3t}) \tag{6}$$

However, $O_{4t}$ and $O_{3t}$ can only be accurately calculated if $I_3$ and $I_4$ are known. This is not necessarily so if the internal analog reference 32 only approximates an absolute value. However, $O_{3t}$ and $O_{4t}$ can be solved for. From equations (1) and (2):

$$O_{3t}=(O_3-B_1)/A_1 \tag{7}$$

$$O_{4t}=(O_4-B_1)/A_1 \tag{8}$$

Combining equations (6)–(8):

$$A=A_1*(O_4'-O_3')/(O_4-O_3) \tag{9}$$

Combining equations (3), (7) and (9), and the fact that $O_{3t}=O_{3t}$', it follows that:

$$B=(O_4'^*O_3-B_1^*O_4'-O_4^*O_3'+B_1^*O_3')/(O_3-O_4) \quad (10)$$

The compensated output is then determined as:

$$O_{comp}=(O_{pre-comp}-B)/A$$

Numerous other embodiments are within the broad scope of the invention. For instance, both of the embodiments shown in FIGS. 2 and 3 can calibrate for initial gain and offset errors by using a table of correction values, instead of calculating the actual initial offset and gain errors. For instance, if a 10-bit analog-to-digital converter is used, the first input reference signal set can consist of the 1024 input reference signals corresponding to the ideal output for all 1024 possible outputs. The output response to each input reference signal is then compared to the ideal theoretical response, and the difference is stored in the non-volatile memory storage device 34 as an entry in the "correction" table. Then, when the data processor is later used, the microprocessor 36 simply compensates the output response by using the corresponding correction value located in the non-volatile memory storage device 34. Alternately, a "look-up" table can be created with an associated ideal output response for each uncompensated output response. Then, the microprocessor 36 would output the ideal digital output response associated with each uncompensated digital output response. These embodiments have the further advantage of being able to calibrate non-linear data processors, such as those that utilize logarithmic data converters.

In FIG. 4, another preferred embodiment of the invention is shown in the context of a digital-to-analog processor 50. In FIG. 4, a precision analog meter with digital output 52 is applied at the external input 54 to the digital-to-analog processor 50. The external input 54 is connected to a microprocessor 58, which in turn is connected to a non-volatile memory storage device 56 and a digital-to-analog converter 60. The analog-to-digital converter 60 is attached to an internal analog reference 62 and a buffer 64. The output from the digital-to-analog processor 50 is taken from the output of the buffer 64, and is applied to the precision analog meter with digital output 52.

The digital-to-analog processor's initial gain and offset errors are determined by applying digital signals I1 and I2 from the precision analog meter with digital output 52 to the external input 54. After I1 and I2 are processed through the digital-to-analog processor 50, their corresponding output analog signals O1 and O2, respectively, are measured by the precision analog meter with digital output 52. The initial gain and offset errors, $A_1$ and $B_1$, respectively, can then be calculated as follows:

$$A_1=(O_1-O_2)/(O_{1t}-O_{2t})$$

$$B_1=O_2-O_{2t}^*A_1$$

where $O_{1t}$ and $O_{2t}$ are the ideal analog output signals to $I_1$ and $I_2$, respectively. As with the preferred embodiments shown in FIGS. 2 and 3, either the calculated values of A1 and B1 or the values of $O_1$ and $O_2$ can be stored in the non-volatile memory storage device 56. During actual use of the digital-to-analog processor 50, the microprocessor 58 recalls the stored set of values to compensate for the digital-to-analog processor's initial gain and offset errors before the input digital signal is processed through the digital-to-analog converter 60. The compensated output response from the microprocessor 58, $O_{comp}$, which is sent to the digital-to-analog converter 60, is computed as:

$$O_{comp}=(O_{pre-comp}-B_1)/A_1.$$

Thus, the invention can be readily implemented to calibrate for a digital-to-analog data processor's initial gain and offset errors.

Other embodiments of the invention can use additional input reference signals in the first input reference signal set to obtain multiple values for $A_1$ and $B_1$, which can be averaged to increase accuracy. Likewise, additional input reference signals can be used in the second input reference signal set to obtain multiple values for A2 and B2, which can be averaged to increase accuracy.

Calibration can be performed during the manufacture of the data processor, especially since it is likely that any necessary equipment is readily available on-site. However, calibration can be performed at any time prior to actual use, and, as would be apparent to one skilled in the art, calibration can be re-performed if necessary. Moreover, if any of the data processor's components are replaced subsequent to an initial calibration, the entire calibration process should be repeated to ensure that the data processor remains accurately calibrated.

It is recognized that the data processor's resolution may suffer slightly due to the margin required for error correction at the high and low ends of the conversion range. This reduction is equal to the maximum absolute error of the entire data conversion system. However, the reduction in resolution can readily be accounted for by using a higher bit-count data processor, as shown in Example 1.

EXAMPLE 1

A resolution of 1024 counts is required, the maximum expected offset error is 5% and the maximum gain error is 5%. Generally, a 10-bit data processor provides a resolution of 1024 counts. At the low end, the gain error is negligible, so the resolution will only be reduced by the offset error, which is 5%, or 51 counts. At the high end, the maximum error is comprised of both the offset and gain errors, which total 10%, or 102 counts. Thus, the 1024 counts will be reduced by 153 (=51+102) counts to 871 counts over the same analog range and an upgrade to a higher bit processor is needed to achieve the desired resolution. If an 11-bit processor is used, the loss in resolution amounts to about 308 (=102+206) counts. Thus, a resolution of 2048−308= 1740 counts is obtained over the analog measurement range and readily satisfies the requirement of 1024 counts. Moreover, the upgrade to an 11-bit processor costs less than the corresponding increase of buying an internal analog reference which would have yielded the same accuracy using conventional calibration techniques.

Accordingly, a system and method for calibrating data processors has been disclosed. It will be appreciated that the scope of the invention includes applications to any signal processing circuit which incorporates an analog reference. The invention, therefore, is not to be restricted except in the spirit of the appended claims.

We claim:

1. A method of calibrating the output of a data processor, comprising the steps of:

applying first and second analog input reference signals $I_1$ and $I_2$ from an accurate external reference to generate respective first and second digital output values $O_1$ and $O_2$;

comparing $O_1$ and $O_2$ with respective ideal digital output values $O_{1t}$ and $O_{2t}$ to determine initial gain and offset errors $A_1$ and $B_1$, respectively, where $A_1=(O_1-O_2)/(O_{1t}-O_{2t})$, where $B_1=(O_2-O_{2t})^*A_1$, and where $I_1$ and $I_2$ are selected so that their corresponding respective ideal digital output values $O_{1t}$ and $O_{2t}$ are relatively close to the minimum and maximum output values of an analog-to-digital converter circuit within the data processor;

storing $A_1$ and $B_1$ in an internal memory storage device;

applying an input signal $I_{in}$ to the data processor to generate a non-calibrated output signal $O_{pre-comp}$; and compensating $O_{pre-comp}$ to thereby output a calibrated signal $O_{comp}$ to account for initial gain and offset errors $A_1$ and $B_1$, where $O_{comp}=(O_{pre-comp}-B_1)/A_1$.

2. The method of claim 1, comprising the further steps of:

applying a third input reference signal $I_3$ from an internal analog reference to the data processor at approximately the same time errors $A_1$ and $B_1$ are determined, to thereby generate a third digital output value $O_3$;

storing $O_3$ in the memory storage device;

applying a fourth input reference signal $I_4$ from the internal analog reference just prior to applying $I_{in}$, to thereby generate a fourth digital output value $O_4$, where $I_3$ is substantially equal to $I_4$;

recalling $O_3$ from the memory storage device;

comparing $O_3$ with $O_4$ to determine a subsequent drift error $B_2$ in the data processor between the time $I_3$ and $I_4$ are respectively applied, where $B_2=O_4-O_3$; and compensating $O_{pre-comp}$ to account for subsequent drift terror $B_2$ in addition to initial gain and offset errors $A_1$ and $B_1$, to thereby output a calibrated signal $O_{comp2}$, where $O_{comp2}=(O_{pre-comp}-B_1)/A_1$.

* * * * *